(12) United States Patent
Gutsul (10) Patent No.: US 11,670,940 B2
(45) Date of Patent: Jun. 6, 2023

(54) ELECTROSTATIC DISCHARGE, ESD, PROTECTION DEVICE FOR A UNIVERSAL SERIAL BUS, USB, INTERFACE

(71) Applicant: Infineon Technologies AG, Neubiberg (DE)

(72) Inventor: Anton Gutsul, Oberpframmern (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/341,982

(22) Filed: Jun. 8, 2021

(65) Prior Publication Data

US 2022/0006289 A1 Jan. 6, 2022

(30) Foreign Application Priority Data

Jul. 2, 2020 (EP) .................................... 20183688

(51) Int. Cl.
*H02H 9/04* (2006.01)

(52) U.S. Cl.
CPC .................................. *H02H 9/046* (2013.01)

(58) Field of Classification Search
CPC .......... H02H 9/042; H02H 3/025; H02H 3/08; H02H 3/205; H02H 3/02; H02H 9/04; H02H 3/20; G01R 19/145; G01R 19/175; H01C 7/10; H01F 19/08; H03K 17/08
USPC .......................................................... 361/56
See application file for complete search history.

(56) References Cited

U.S. PATENT DOCUMENTS

| | | | | |
|---|---|---|---|---|
| 7,355,476 B2* | 4/2008 | Kasha | ...................... | H04B 1/18 330/298 |
| 7,649,726 B2* | 1/2010 | Castro | .................... | H02H 9/045 361/111 |
| 7,667,542 B2* | 2/2010 | Kasha | ................. | H03F 3/45183 330/298 |
| 7,855,866 B2* | 12/2010 | Crawley | ............... | H04L 25/029 361/111 |
| 8,537,517 B1* | 9/2013 | Banak | .................... | H02H 9/025 361/93.1 |

(Continued)

FOREIGN PATENT DOCUMENTS

| CN | 203607833 U | * | 5/2014 |
|---|---|---|---|
| CN | 104979874 A | | 10/2015 |

(Continued)

OTHER PUBLICATIONS

Universal Serial Bus 4 (USB4™) Specification, Apple Inc. HP Inc., Intel Corporation Microsoft Corporation Renesas Corporation STMicroelectronics Texas Instruments, Version 1.0 with Errata and ECN through Oct. 15, 2020, pp. 1-591.

(Continued)

*Primary Examiner* — Dharti H Patel
(74) *Attorney, Agent, or Firm* — Armis IP Law, LLC (57) ABSTRACT

The present disclosure relates to an ESD protection device (240) for a USB interface (210). The ESD protection device (240) comprises an ESD protection component (246) configured to limit a voltage applied to the USB interface (210) and at least one discharge resistor (244, 244.1, 244.2) configured to discharge an AC coupling capacitor (242) of the USB interface (210). The ESD protection component (246) and the discharge resistor (244, 244.1, 244.2) are incorporated in a single electronic component (245).

23 Claims, 5 Drawing Sheets

(56) References Cited

U.S. PATENT DOCUMENTS

| | | | | |
|---|---|---|---|---|
| 9,093,977 | B2* | 7/2015 | Jin | H02H 9/04 |
| 10,312,742 | B1* | 6/2019 | Al-Shehab | H02J 7/342 |
| 10,424,950 | B2* | 9/2019 | Chen | H01L 27/0255 |
| 10,483,757 | B1* | 11/2019 | Banak | H02H 9/041 |
| 11,329,662 | B2* | 5/2022 | Schifmann | H03F 3/45179 |
| 2007/0052482 | A1* | 3/2007 | Kasha | H03F 3/45183 |
| | | | | 330/302 |
| 2008/0246343 | A1* | 10/2008 | Xu | G06F 1/266 |
| | | | | 307/126 |
| 2010/0084551 | A1 | 4/2010 | Kawato | |
| 2016/0056626 | A1* | 2/2016 | Kawam | H01R 25/006 |
| | | | | 361/56 |
| 2016/0291663 | A1* | 10/2016 | Sun | G06F 13/4022 |
| 2019/0319447 | A1* | 10/2019 | Mukhopadhyay | G06F 13/4295 |
| 2020/0036563 | A1 | 1/2020 | Talbot et al. | |
| 2020/0083705 | A1* | 3/2020 | Xavier | H01L 27/0285 |
| 2021/0098987 | A1* | 4/2021 | Walimbe | H01L 23/145 |

FOREIGN PATENT DOCUMENTS

| | | | | |
|---|---|---|---|---|
| EP | 2498167 | A1 | 9/2012 | |
| EP | 2849023 | A1 | 3/2015 | |
| WO | WO-2014185599 | A1 * | 11/2014 | H01L 27/0288 |

OTHER PUBLICATIONS

Compaq, Hewlett-Packard, Intel, Lucent, Microsoft, NEC, Philips, "Universal Serial Bus 4 Specification, Revision 2.0", Apr. 27, 2000, vol. Revision 2.0, Apr. 27, 2000 (Apr. 27, 2000), pp. 1-650, XP008147911, Retrieved from the Internet: URL:http://www.usb.org/developers/docs/usb_20_052510.zip.

Office Action, EP 20 183 688.9, dated Oct. 14, 2021, pp. 1-7.

Extended Search Report, EP20183688.9, dated Dec. 11, 2020, pp. 1-6.

* cited by examiner

ELECTROSTATIC DISCHARGE, ESD, PROTECTION DEVICE FOR A UNIVERSAL SERIAL BUS, USB, INTERFACE

RELATED APPLICATION

This application claims priority to earlier filed European Patent Application Serial Number EP20183688 entitled "An electrostatic discharge, ESD, protection device for a Universal Serial Bus, USB, interface,", filed on Jul. 2, 2020, the entire teachings of which are incorporated herein by this reference.

FIELD

Embodiments of the present disclosure relate to an electrostatic (ESD) protection device. In particular, embodiments relate to an ESD protection device for a Universal Serial Bus, USB, interface.

BACKGROUND

USB 3.2 or USB 4 interfaces can be extremely sensitive to ESD strikes. ESD strikes, for example, cause damage to components such as hubs, routers, or controllers of the USB interface. Therefore, some USB interfaces comprise ESD protection devices to prevent malfunctions or breakdowns. USB 4 interfaces also require AC coupling for filtering out DC components from input or output signals.

An integration of an AC coupling and ESD protection functionality in USB interfaces may increase a part count, costs, and space requirements.

SUMMARY

Hence, there may be a demand for improved integration of an AC coupling and ESD protection functionality in USB interfaces.

The demand may be satisfied by the subject-matter of the appended independent and dependent claims.

According to one aspect, the present disclosure relates to an ESD protection device for a USB interface. The ESD protection device comprises an ESD protection component configured to limit a voltage applied to the USB interface and at least one discharge resistor configured to discharge an AC coupling capacitor of the USB interface. The ESD protection component and the discharge resistor are incorporated in a single electronic component.

According to a further aspect, the present disclosure relates to an electronic device comprising a USB interface, comprising at least one AC coupling capacitor. Further, the electronic device comprises at least one ESD protection device. The ESD protection device comprises an ESD protection component configured to limit a voltage applied to the USB interface and at least one discharge resistor configured to discharge the AC coupling capacitor of the USB interface. The ESD protection component and the discharge resistor are incorporated in a single electronic component.

Further embodiments herein include, an electrostatic discharge (ESD) protection device for a Universal Serial Bus (USB) interface, the ESD protection device comprising: an ESD protection component operative to limit a voltage applied to the USB interface; at least one discharge resistor operative to discharge an AC coupling capacitor of the USB interface; and the ESD protection component and the discharge resistor being incorporated in a single electronic component.

In one embodiment, the electronic component of the electrostatic discharge protection device is configured as at least one of a packaged electronic component and a bare die assembly. The electronic component is configured as a packaged electronic component. Additionally, or alternatively, the electronic component is configured as a bare die assembly.

In further example embodiments, the ESD protection component and the discharge resistor are disposed on a single die of the electronic component.

In yet further example embodiments, the electronic component comprises a first die and a second die, wherein the ESD protection component is disposed on the first die and the discharge resistor is disposed on the second die.

In one non-limiting example embodiment, the AC coupling capacitor has a capacitance between 300 nF (nano-Farad) and 363 nF; and the discharge resistor has a resistance between 200 kΩ (kilo-ohm) and 242 kΩ. However, these values may vary depending on the embodiment.

The AC coupling capacitor has a capacitance such as between 100 nF and 500 nF or any other suitable value.

In still further example embodiments, the electrostatic discharge protection component comprises at least one diode configured to limit the voltage applied to the USB interface.

In yet further example embodiments, the electrostatic discharge protection component comprises a pair of diodes operative to limit the voltage applied to the USB interface; in one embodiment, the pair of diodes is coupled back-to-back.

In still further example embodiments, the electrostatic discharge protection component comprises a semiconductor device having four layers of alternating p- and n-type materials; herein the semiconductor device is operative to limit the voltage applied to the USB interface.

Still further example embodiments include an electronic device comprising: a Universal Serial Bus interface comprising at least one AC coupling capacitor; and
at least one electrostatic discharge protection device comprising: i) an electrostatic discharge protection component operative to limit a voltage applied to the USB interface; and
ii) at least one discharge resistor operative to discharge the AC coupling capacitor,
the electrostatic discharge protection component and the discharge resistor being incorporated in a single electronic component.

Further example embodiments herein include an electronic component configured as at least one of a packaged electronic component and a bare die assembly.

In yet further example embodiments, the electronic device as discussed herein includes: a first electrostatic discharge protection device comprising: a first electrostatic discharge protection component operative to limit the voltage applied to the USB interface; and a first discharge resistor configured to discharge a first AC coupling capacitor of the USB interface,
wherein the first electrostatic discharge protection component and the first discharge resistor are incorporated in a single first electronic component; and
a second electrostatic discharge protection device comprising: a second electrostatic discharge protection component operative to limit the voltage applied to the USB interface; and
a second discharge resistor operative to discharge a second AC coupling capacitor of the USB interface, wherein the second electrostatic discharge protection component and the second discharge resistor are incorporated in a single second electronic component.

An additional summary of embodiments is further discussed below.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
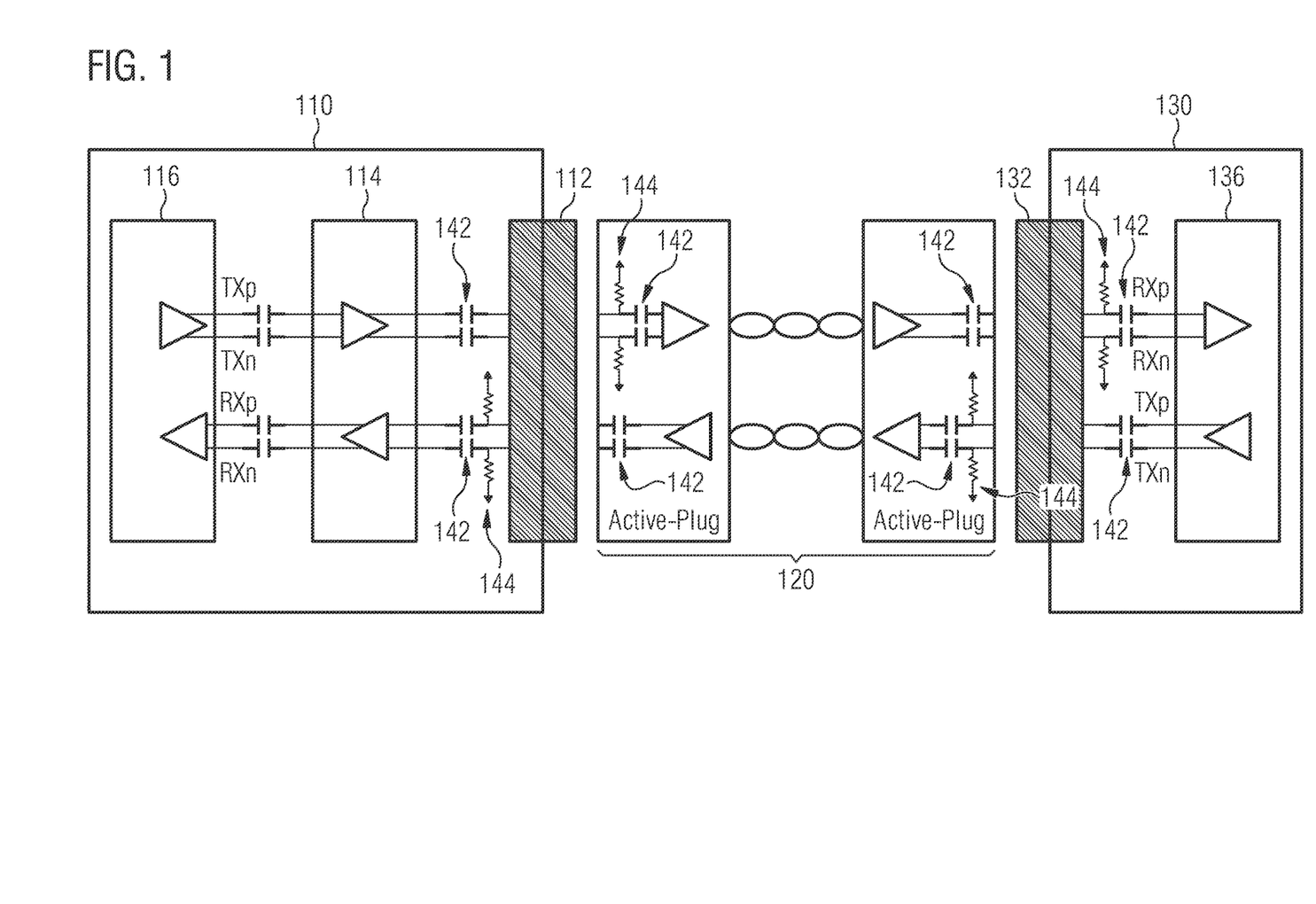
FIG. 1 illustrates a known concept of a USB interface including an AC coupling capacitor and a discharge resistor for AC coupling.

FIG. 1 illustrates a known concept of a USB interface. In particular, FIG. 1 shows a circuit diagram schematically depicting a first electronic device 110 and a second electronic device 130 interconnected by their USB receptacles 112 and 132 via an active cable 120 to enable a communication between the first and the second electronic device 110 and 130.

The first electronic device 110, for example, is a USB device, whereas the second electronic device 130 is a USB host. In an alternative configuration, device 110 may be a USB host and device 130 is a USB device.

As can be seen, the USB device 110 and the USB host 130 comprise a device router 116 and a host router 136, respectively, which can communicate with each other using a communication signal. The USB device 110 further includes a re-timer 114 for a compensation of distortions of the communication signal.

The example of FIG. 1 particularly relates to USB 3.2 or USB 4 applications which may comprise an AC coupling functionality according to the "Universal Series Bus 4 (USB4) Specification (Version 1.0, August 2019). For AC coupling, the USB device 110 and the USB host 130 are equipped with a high pass filter including capacitors 142 and resistors 144 placed downstream from the receptacles 112 and 132. As well, such capacitors 142 are disposed at ends of the active cable 120. In this way, interfering DC components of the communication signal can be filtered out.

An implementation of a separate, discrete ESD protection device in the USB device 110 and/or the USB host 130 may lead to an increased part count, costs, and space requirements. Due to a limited installation space in some applications, the implementation of said discrete ESD protection device may not be possible.

Figure 2:
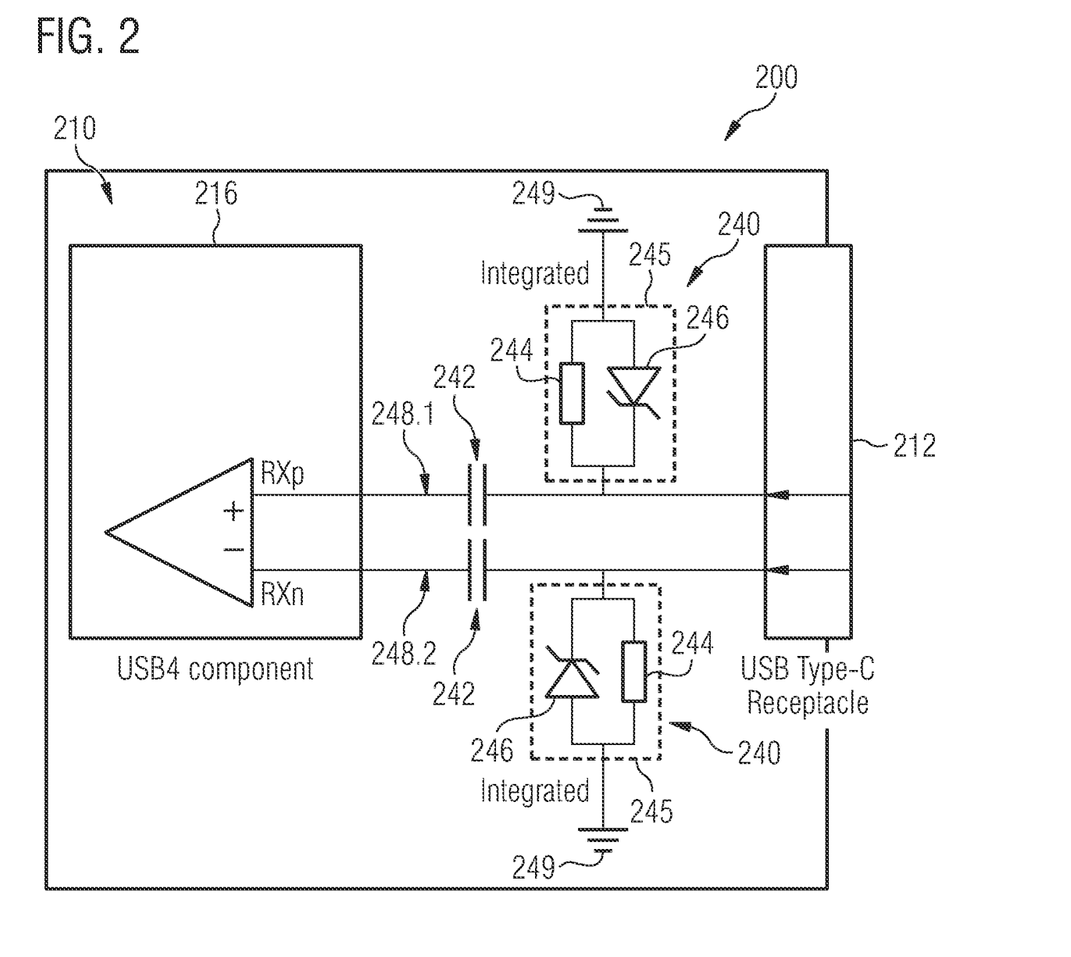
FIG. 2 illustrates a USB interface having an ESD protection device for ESD protection and AC coupling.

With reference to FIG. 2, an improved concept for ESD protection in USB interfaces is shown.

Explicitly, FIG. 2 shows an electronic device 200 with a USB interface 210 which can be a USB device, a USB hub or a USB host. The electronic device 200 can be a computer, a smartphone, a data (mass) storage, or another electronic device. The USB interface 210 particularly relates to USB 3.2 and USB 4 applications.

The USB interface 210 comprises a USB router 216 and a USB receptacle 212 for coupling the USB router 216 to external devices. The USB receptacle 212, for example, is a USB Type-C receptacle. For differential signal transmission, an input (receive path) of the USB router 216 includes a first and a second data line 248.1 and 248.2 connecting the USB router 216 to the USB receptacle 212. For AC coupling, an AC coupling capacitor 242 is placed in each of the data lines 248.1 and 248.2 between the USB router 216 and the USB receptacle 212. The USB router 216 and the AC coupling capacitors 242, for example, are arranged on a printed circuit board (PCB).

Each of the data lines 248.1 and 248.2 is coupled to an ESD protection device 240 comprising a discharge resistor 244 and an ESD protection component 246 which in FIG. 2 includes a Zener diode.

A fundamental operating principle of the ESD protection device 240 is that a conductivity of the ESD protection component 246 (e.g. the Zener diode) is (significantly) lower than that of the USB router 216 or ideally zero if a voltage applied to the USB interface 210 (i.e. the USB receptacle 212) falls short of a predefined (hazardous) voltage level, and increases if an over-voltage exceeding the predefined voltage level is applied.

This enables the ESD protection device 240 to drain the over-voltage exceeding the said predefined voltage level to an external (e.g. ground) potential 249, e.g. in the event of an ESD strike, and protect the USB router 216 from hazardous over-voltages. In particular, the conductivity of the ESD protection component 246 can exceed the conductivity of the USB router 216.

To this end, a breakdown voltage of the ESD protection component 246 can be set such that over-voltages (e.g. resulting from ESD strikes) hazardous to the USB router 216 lead to a breakdown of the ESD protection component 246 and the over-voltages can be drained via the ESD protection component 246. In this way, the ESD protection component 246 limits the voltage applied to the USB interface 210. A skilled person having benefit from the present disclosure will appreciate that the breakdown voltage of the ESD protection component 246 can be adjusted by its internal structure (e.g. its doping) to adapt the ESD protection device 240 to different applications.

During "regular" operation, when the voltage applied by a communication signal is lower than the predefined voltage level, a resistance of the ESD protection component 246 in the direction of the external potential 249 is higher than that of the discharge resistor 244 and the AC coupling capacitor 242 is predominately discharged by the discharge resistor 244. The higher the resistance of the ESD protection component 246 during regular operation is, the lower may be an undesired leakage current via the ESD protection device 240.

The skilled person will appreciate that the ESD protection device 240 can additionally or alternatively be used to protect the USB interface 210 from over-voltages which do not result from ESD strikes but from operating errors or malfunctions.

Alternatively, the ESD protection component can comprise one or more varistors, thyristors, other diodes (e.g. avalanche diodes, transient-voltage-suppression diodes), or combinations thereof. Combinations of multiple diodes, for example, are used for "bidirectional" ESD protection, as stated in more detail later.

The ESD protection component 246 and the discharge resistor 244 are incorporated in a single electronic component 245 which can be placed on the PCB carrying the USB router 216 and the AC coupling capacitors 242. This allows a more space-saving integration of the discharge resistor 244 and the ESD protection component 246 than a separate arrangement of, for example, a discrete discharge resistor and a discrete ESD protection component.

The electronic component 245 can be configured as a packaged component or a bare die assembly, both of which can comprise one or multiple dies or substrates. Thus, the discharge resistor 244 and the ESD protection component 246 can be arranged on a mutual die/substrate or separate dies/substrates of the packaged component or the bare die assembly, respectively.

In the following examples, discharge resistor 244 and ESD protection component are arranged on a mutual (i.e. same) die.

Examples of a packaged component are a chip-scale package (CSP), small outline package (SOP), flat package, and a surface-mounted device (SMD).

The ESD protection component 246 and the discharge resistor 244 can be coupled to the data lines 248.1 and 248.2, respectively, via a single pad of the electronic component 245. Hence, a number of solder joints and electrical parasitics thereof may be reduced compared to the separate arrangement of the discrete resistor and ESD protection component.

In addition, production costs can be reduced by the integration of the ESD protection component 246 and the discharge resistor 244 in the single electronic component 245.

The above electronic component 245 can further enable an integration of ESD protection or AC coupling in applications where no dedicated place was reserved for it, for example, by replacing a discrete discharge resistor with the electronic component 245.

It is noted that even though FIG. 2 merely addresses the (data) input (receive path) of the USB router 216, the ESD protection device 240 herein can be additionally or alternatively applied to an (data) output (transmit path) of the USB router 216.

In the receive path of USB 4 applications, the AC coupling capacitors 242 may have any suitable capacitance as between 300 nF and 363 nF and the discharge resistors 244 may have any suitable resistance such as between 200 kΩ and 242 kΩ.

In the transmit path of USB 4 applications, the AC coupling capacitors 242 may have any suitable capacitance such as a capacitance between 135 nF and 265 nF.

Figure 3:
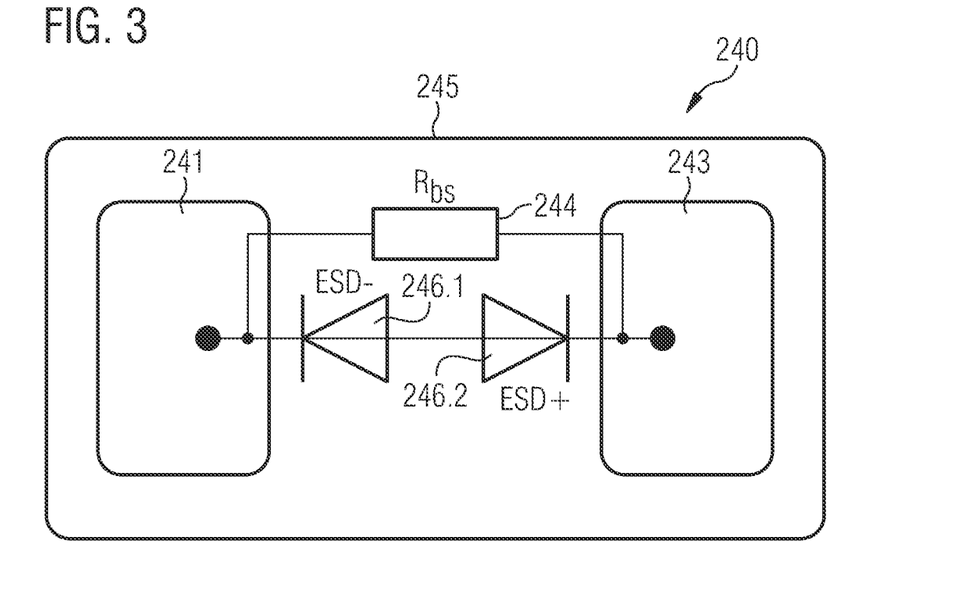
FIG. 3 illustrates a first example of the ESD protection device.

FIG. 3 shows an example of the electronic component 245 where the ESD protection component 246 connecting a first pad 241 and a second pad 243 of the ESD protection device 240 comprises a first diode 246.1 and a second diode 246.2 connected "back-to-back" to each other. That is, forward directions, as well as reverse directions of the first and the second 246.1 and 246.2, are opposite to each other. Thus, the ESD protection component 246 enables (bidirectional) ESD protection from positive and negative over-voltages. To be more specific, the first and the second diode 246.1 and 246.2 are connected serially to each other. In some embodiments, the first and the second diode 246.1 and 246.2 may alternatively be connected in parallel to each other.

The first and the second diode 246.1 and 246.2 again can be Zener diodes, avalanche diodes, Schottky diodes or a combination thereof.

Due to the bidirectional ESD protection, either the first pad 241 can be connected to the external (ground) potential 249, while the second pad 243 can be connected to the USB interface 210 or vice versa.

In FIG. 3, the discharge resistor 244 with resistance $R_{bs}$ is connected in parallel to the first and the second diode 246.1 and 246.2.

It is noted that FIG. 3 merely illustrates a schematic circuit diagram of the electronic component 245. In practice, the first, and the second diode 246.1 and 246.2 can be placed differently than shown in FIG. 3.

Figure 4A:
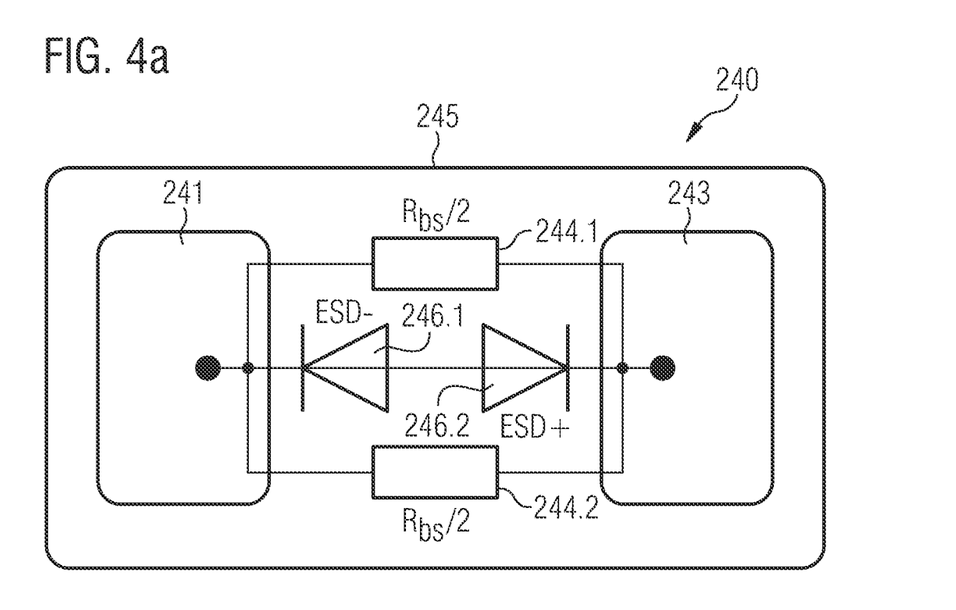
FIG. 4a illustrates a second example of the ESD protection device.

FIG. 4a illustrates another example of the electronic component 245 where the discharge resistor 244 is replaced by a first resistor 244.1 and a second resistor 244.2 connected in parallel, each of the resistors 244.1 and 244.2 having half the resistance $R_{bs}$ of the discharge resistor 244.

Separate resistors (i.e. the first and the second resistor 244.1 and 244.2) may be technically easier to produce and/or implement than a single one (e.g. discharge resistor 244).

Figure 4B:
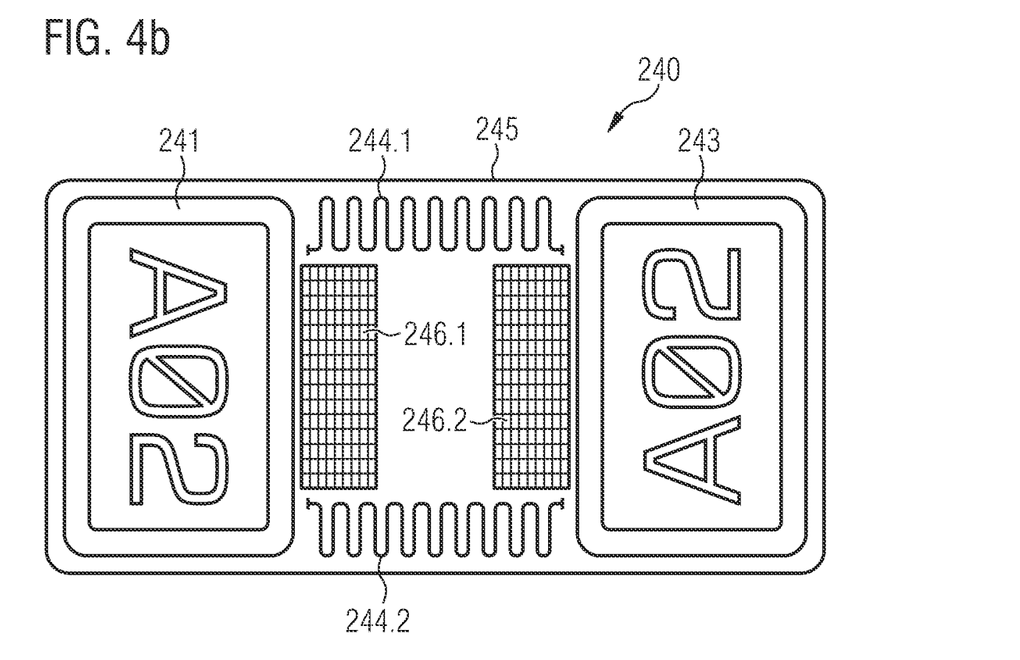
FIG. 4b illustrates a layout of the second example of the ESD protection device.

FIG. 4*b* shows an optional layout of the previous example of the ESD protection device 240.

As can be seen in FIG. 4*b*, the first and the second resistor 244.1 and 244.2, for example, are preferably configured as a meander line (e.g. polysilicon) resistors, as they are (technically) easier to design and manufacture vis-à-vis other resistors.

Figure 5:
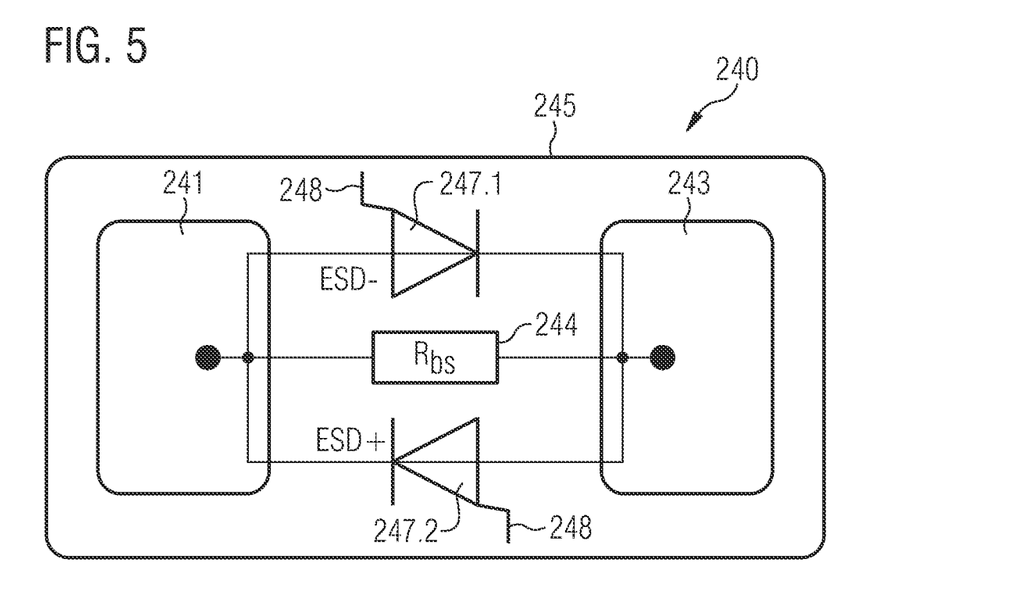
FIG. 5 illustrates a third example of the ESD protection device.

FIG. 5 shows another example of the ESD protection device 240. In FIG. 5, the ESD protection component 246 comprises a first semiconductor device 247.1 and a second semiconductor device 247.2 both having four layers of alternating p- and n-type materials (here indicated by the circuit symbol of a thyristor). The first and the second semiconductor device 247.1 and 247.2 are connected in parallel to each other, i.e. in a so-called "parallel configuration". Moreover, the first and the second semiconductor device 247.1 and 247.2 are arranged "back-to-back". That is, the first and the second semiconductor device 247.1 and 247.2 have opposite forward directions and opposite reverse directions to enable bidirectional over-voltage or ESD protection. Moreover, the first and the semiconductor device 247.1 and 247.1 protect each other from damages resulting from over-voltages in reverse direction in the aforementioned back-to-back arrangement.

The skilled person having benefit from the present disclosure will appreciate that thyristors (e.g. the first and the second thyristor 247.1 and 247.2) may provide an improved protection performance vis-á-vis diodes in ESD protection components due to their "deeper snapback" and lower clamping voltage.

The (single) discharge resistor 244 is connected in parallel to the first and the second thyristor 247.1 and 247.2.

Figure 6:
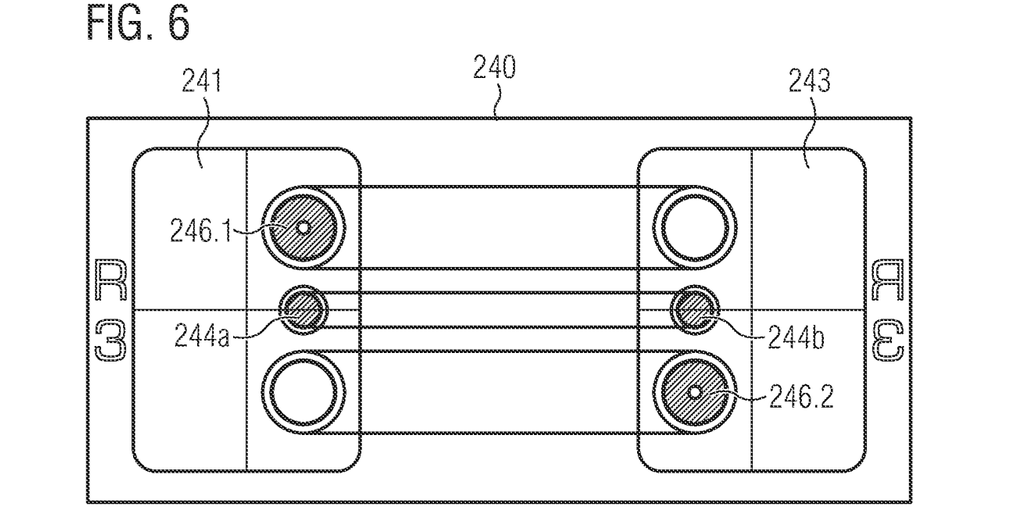
FIG. 6 illustrates a layout of the third example of the ESD protection device.

FIG. 6 shows another example of the ESD protection device 240.

In FIG. 6, the ESD protection device 240 includes a first serial resistor 244*a* and a second serial resistor 244*b* connected in series to each other, while first and the second diode 246.1 and 246.2. are connected in parallel to the serial resistors 244*a* and 244*b*. The first and the second serial resistor 244*a* and 244*b*, for example, are configured as a polysilicon resistor formed in a polysilicon layer beneath the first and the second pad 241 and 243, respectively.

Similarly, the first and the second diode 246.1 and 246.2 can be formed in the polysilicon layer.

Figure 7:
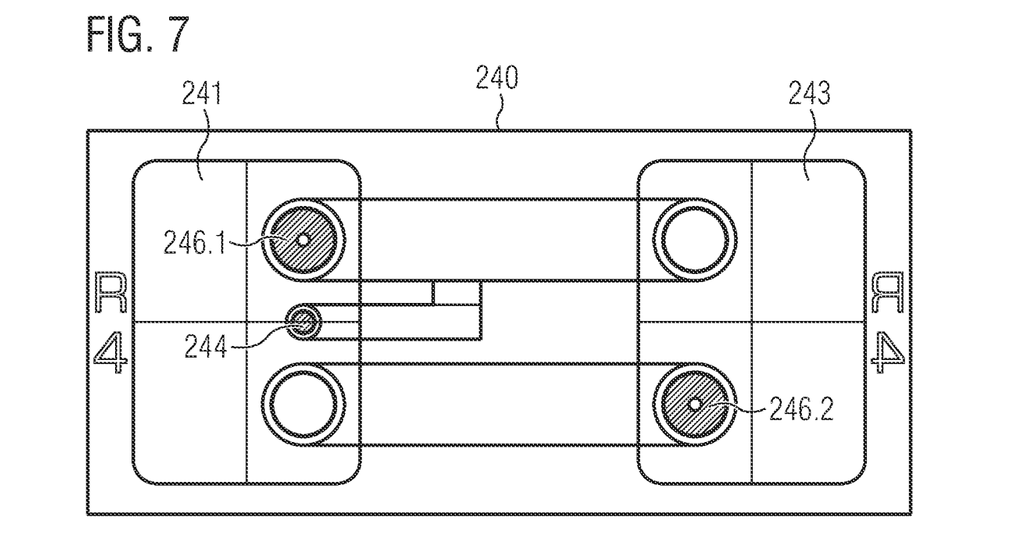
FIG. 7 illustrates another layout of the third example of the ESD protection device.

Analogously, the discharge resistor 244 in FIG. 7 may be a polysilicon resistor formed in the polysilicon layer adjacent to the first pad 241. The discharge resistor 244 is coupled to a connection of the first diode 246.1 to the second pad 243.

It should be noted, that the above examples merely partly cover an entirety of various possible embodiments and that the features (e.g. diodes and resistors) described in FIG. 2 to FIG. 7 can be combined in different ways to realize the aforementioned concept.

The examples as described herein may be summarized as follows:

Examples of the present disclosure relate to an ESD protection device for a USB interface. The ESD protection device comprises an ESD protection component configured to limit a voltage applied to the USB interface and at least one discharge resistor configured to discharge an AC coupling capacitor of the USB interface The ESD protection component and the discharge resistor are incorporated in a single electronic component.

In some examples, the electronic component is configured as at least one of a packaged electronic component and a bare die assembly.

According to some examples, the electronic component is configured as a packaged electronic component.

In some examples, the electronic component is configured as a bare die assembly.

According to some examples, the ESD protection component and the discharge resistor are disposed on a single die of the electronic component.

In some examples, the electronic component comprises a first die and a second die, wherein the ESD protection component is disposed on the first die and the discharge resistor is disposed on the second die.

According to some examples, the AC coupling capacitor has a capacitance between 300 nF and 363 nF and the discharge resistor has a resistance between 200 kΩ and 242 kΩ.

In some examples, the AC coupling capacitor has a capacitance between 100 nF and 500 nF.

According to some examples, the ESD protection component comprises at least one diode configured to limit the voltage applied to the USB interface.

In some examples, the ESD protection component comprises a pair of back-to-back diodes configured to limit the voltage applied to the USB interface.

According to some examples, the ESD protection component comprises a semiconductor device having four layers of alternating p- and n-type materials, wherein the semiconductor device is configured to limit the voltage applied to the USB interface.

Some examples relate to an electronic device comprising a USB interface which comprises at least one AC coupling capacitor and at least one ESD protection device comprising. The ESD protection device comprises an ESD protection component configured to limit a voltage applied to the USB interface and at least one discharge resistor configured to discharge the AC coupling capacitor of the USB interface. The ESD protection component and the discharge resistor are incorporated in a single electronic component.

In some examples, the electronic component is configured as at least one of a packaged electronic component and a bare die assembly.

According to some examples, the electronic device comprises a first ESD protection device comprising a first ESD protection component configured to limit the voltage applied to the USB interface and a first discharge resistor configured to discharge a first AC coupling capacitor of the USB interface. The first ESD protection component and the first discharge resistor are incorporated in a single first electronic component. The electronic device further comprises a second ESD protection device comprising a second ESD protection component configured to limit the voltage applied to the USB interface and a second discharge resistor configured to discharge a second AC coupling capacitor of the USB interface. The second ESD protection component and the second discharge resistor are incorporated in a single second electronic component.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. An ElectroStatic Discharge (ESD) protection device for a Universal Serial Bus (USB) interface, the ESD protection device comprising:
    an ESD protection component operative to limit a voltage applied to the USB interface;
    at least one discharge resistor operative to discharge an AC coupling capacitor of the USB interface;
    the ESD protection component and the discharge resistor being incorporated in a single electronic component assembly; and
    wherein the single electronic component assembly is installed in a circuit coupled to the USB interface and provides ESD protection to a first data line of a data line pair of the USB interface, the single electronic component assembly providing the ESD protection independent of a voltage of a second data line of the data line pair of the USB interface.

2. The ESD protection device of claim 1, wherein the single electronic component assembly is configured as a packaged electronic component.

3. The ESD protection device of claim 1, wherein the single electronic component assembly is configured as a bare die assembly.

4. The ESD protection device of claim 1, wherein the ESD protection component and the discharge resistor are disposed on a single die of the single electronic component assembly.

5. The ESD protection device of claim 1, wherein the single electronic component assembly comprises a first die and a second die, wherein the ESD protection component is disposed on the first die and the discharge resistor is disposed on the second die.

6. The ESD protection device of claim 1,
    wherein the AC coupling capacitor has a capacitance between 300 nF and 363 nF; and
    wherein at least one the discharge resistor has a resistance between 200 kΩ and 242 kΩ.

7. The ESD protection device of claim 1, wherein the AC coupling capacitor has a capacitance between 100 nF and 500 nF.

8. The ESD protection device of claim 1, wherein the ESD protection component comprises at least one diode operative to limit the voltage applied to the USB interface.

9. The ESD protection device of claim 8, wherein the ESD protection component comprises a pair of diodes operative to limit the voltage applied to the USB interface, wherein the pair of diodes is coupled back-to-back.

10. The ESD protection device of claim 1, wherein the ESD protection component comprises a semiconductor device having four layers of alternating p- and n-type materials, and wherein the semiconductor device is operative to limit the voltage applied to the USB interface.

11. The ESD protection device of claim 1, wherein the ESD protection component and the discharge resistor are incorporated in the single electronic component assembly prior to installation of the single electronic component assembly in a circuit of the USB interface including the AC coupling capacitor.

12. The circuit of claim 11 including the single electronic component assembly connected to the AC coupling capacitor.

13. An electronic device comprising:
    a Universal Serial Bus (USB) interface comprising at least one AC coupling capacitor; and
        at least one electrostatic discharge protection device comprising:
        an electrostatic discharge protection component operative to limit a voltage applied to the USB interface; and
        at least one discharge resistor operative to discharge the AC coupling capacitor,
        the electrostatic discharge protection component and the discharge resistor being incorporated in a single electronic component assembly prior to installation of the single electronic component assembly in a circuit of the USB interface including the AC coupling capacitor;
        wherein the single electronic component assembly is installed in the circuit of the USB interface and provides ESD protection to a first data line of a data line pair in the USB interface, the single electronic component assembly providing the ESD protection independent of a voltage of a second data line of the data line pair.

14. The electronic device of claim 13, wherein the single electronic component assembly is configured as a packaged electronic component.

15. The electronic device of claim 13, wherein the single electronic component assembly is configured as a bare die assembly.

16. An electronic device comprising:
a first electrostatic discharge protection device comprising:
a first electrostatic discharge protection component operative to limit a first voltage applied to a USB interface; and
a first discharge resistor operative to discharge a first AC coupling capacitor of the USB interface,
wherein the first electrostatic discharge protection component and the first discharge resistor are incorporated in a single first electronic component assembly; and
a second electrostatic discharge protection device comprising:
a second electrostatic discharge protection component operative to limit a second voltage applied to the USB interface; and
a second discharge resistor operative to discharge a second AC coupling capacitor of the USB interface,
wherein the second electrostatic discharge protection component and the second discharge resistor are incorporated in a single second electronic component assembly;
wherein the single first electronic component assembly is connected between a first data line of a data line pair of the USB interface and a ground potential;
wherein the single second electronic component assembly is connected between a second data line of the data line pair of the USB interface and the ground potential;
wherein the first single second electronic component assembly provides ESD protection to the first data line independent of a voltage of the second data line; and
wherein the second single second electronic component assembly provides ESD protection to the second data line independent of a voltage of the first data line.

17. An ElectroStatic Discharge (ESD) protection device for a Universal Serial Bus (USB) interface, the ESD protection device comprising:
an ESD protection component operative to limit a voltage applied to the USB interface;
at least one discharge resistor operative to discharge an AC coupling capacitor of the USB interface;
the ESD protection component and the discharge resistor being incorporated in a single electronic component assembly;
wherein the ESD component includes a first node and a second node;
wherein the discharge resistor includes a first node and a second node;
wherein the single electronic component assembly includes a first pad and a second pad;
wherein the first node of the ESD component and the first node of the discharge resistor are directly connected to the first pad; and
wherein the second node of the ESD component and the second node of the discharge resistor are directly connected to the second pad.

18. The ESD protection device of claim 17, wherein the first pad of the single electronic component assembly is connected to the data line subsequent to installation of the single electronic component assembly in the circuit of the USB interface; and
wherein the second pad of the single electronic component assembly is connected to a ground potential associated with the data line subsequent to installation of the single electronic component assembly in the circuit of the USB interface.

19. An ElectroStatic Discharge (ESD) protection device for a Universal Serial Bus (USB) interface, the ESD protection device comprising:
an ESD protection component operative to limit a voltage applied to the USB interface;
at least one discharge resistor operative to discharge an AC coupling capacitor of the USB interface;
the ESD protection component and the discharge resistor being incorporated in a single electronic component assembly;
wherein the single electronic component assembly includes a first pad and a second pad; and
wherein the ESD component and the discharge resistor are connected in parallel between the first pad and the second pad.

20. An ElectroStatic Discharge (ESD) protection device for a Universal Serial Bus (USB) interface, the ESD protection device comprising:
an ESD protection component operative to limit a voltage applied to the USB interface;
at least one discharge resistor operative to discharge an AC coupling capacitor of the USB interface;
the ESD protection component and the discharge resistor being incorporated in a single electronic component assembly; and
wherein the single electronic component assembly provides ESD protection to a first data line of a data line pair in the USB interface, the single electronic component assembly providing the ESD protection to the first data line based on only a voltage of the first data line and not a voltage of a second data line in the data line pair.

21. An ElectroStatic Discharge (ESD) protection device for a Universal Serial Bus (USB) interface, the ESD protection device comprising:
an ESD protection component operative to limit a voltage applied to the USB interface;
at least one discharge resistor operative to discharge an AC coupling capacitor of the USB interface;
the ESD protection component and the discharge resistor being incorporated in a single electronic component assembly; and
wherein a first node of the discharge resistor is directly coupled to a data line of the USB interface.

22. The ESD protection device of claim 21, wherein a second node of the discharge resistor is directly coupled to a ground potential of the USB interface.

23. The ESD protection device of claim 22, wherein the discharge resistor is connected in parallel with the ESD protection component.

* * * * *